(12) United States Patent
Kozicki et al.

(10) Patent No.: US 6,418,049 B1
(45) Date of Patent: *Jul. 9, 2002

(54) PROGRAMMABLE SUB-SURFACE AGGREGATING METALLIZATION STRUCTURE AND METHOD OF MAKING SAME

(75) Inventors: Michael N. Kozicki, Phoenix, AZ (US); William C. West, South Pasadena, CA (US)

(73) Assignee: Arizona Board of Regents, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/555,612

(22) PCT Filed: Dec. 4, 1998

(86) PCT No.: PCT/US98/25830

§ 371 (c)(1),
(2), (4) Date: Jul. 27, 2000

(87) PCT Pub. No.: WO99/28914

PCT Pub. Date: Jun. 10, 1999

Related U.S. Application Data

(60) Provisional application No. 60/067,509, filed on Dec. 4, 1997.

(51) Int. Cl.[7] .............................................. G11C 13/00
(52) U.S. Cl. ....................................... 365/174; 365/182
(58) Field of Search ................................. 365/174, 182

(56) References Cited

U.S. PATENT DOCUMENTS

| | | | |
|---|---|---|---|
| 3,271,591 A | 9/1966 | Ovshinsky | 317/234 R |
| 3,530,441 A | 9/1970 | Ovshinsky | 317/234 R |
| 3,715,634 A | 2/1973 | Ovshinsky | 317/234 R |
| 3,765,956 A | 10/1973 | Li | 148/33 |
| 3,846,767 A | 11/1974 | Cohen | 340/173 R |
| 3,875,566 A | 4/1975 | Helbers | 340/173 R |
| 3,886,577 A | 5/1975 | Buckley | 357/2 |
| 3,980,505 A | 9/1976 | Buckley | 148/1.5 |
| 3,988,720 A | 10/1976 | Ovshinsky | 357/2 |
| 4,199,692 A | 4/1980 | Neale | 307/238 |

(List continued on next page.)

OTHER PUBLICATIONS

Electrical switching in AgI based fast ion conducting glasses: Possibility for newer applications; B. Vaidhyanathan and K.J. Rao, S. Prakash, S. Murugavel, and S. Asokan; J. Appl. Phys 75 (2), Jul. 15, 1995; American Institute of Physics; pp. 1358–1360.

(List continued on next page.)

Primary Examiner—Son T. Dinh
(74) Attorney, Agent, or Firm—Snell & Wilmer LLP

(57) ABSTRACT

A programmable sub-surface aggregating metallization sructure ("PSAM") includes an ion conductor such as a chalcogenide-glass which includes metal ions and at least two electrodes disposed at opposing surfaces of the ion conductor. Preferably, the ion conductor includes a chalcogenide material with Group IB or Group IIB metals. One of the two electrodes is preferably configured as a cathode and the other as an anode. When a voltage is applied between the anode and cathode, a metal dendrite grows from the cathode through the ion conductor towards the anode. The growth rate of the dendrite may be stopped by removing the voltage or the dendrite may be retracted back towards the cathode by reversing the voltage polarity at the anode and cathode. When a voltage is applied for a sufficient length of time, a continuous metal dendrite grows through the ion conductor and connects the electrodes, thereby shorting the device. The continuous metal dendrite then can be broken by applying another voltage. The break in the metal dendrite can be reclosed by applying yet another voltage. Changes in the length of the dendrite or the presence of a break in the dendrite affect the resistance, capacitance, and impedance of the PSAM.

26 Claims, 10 Drawing Sheets

U.S. PATENT DOCUMENTS

| | | | |
|---|---|---|---|
| 5,177,567 A | 1/1993 | Klersy et al. | 365/182 |
| 5,296,835 A | 3/1994 | Nakamura | 338/130 |
| 5,500,532 A | 3/1996 | Kozicki | 250/372 |
| 5,596,500 A | 1/1997 | Sprague et al. | 364/449.7 |
| 5,646,629 A | 7/1997 | Loomis et al. | 342/357 |
| 5,761,115 A * | 6/1998 | Kozicki et al. | 365/182 |
| 5,912,839 A | 6/1999 | Ovshinsky et al. | 365/185.03 |
| 5,914,893 A | 6/1999 | Kozicki et al. | 365/107 |
| 5,933,365 A | 8/1999 | Klersy et al. | 365/148 |

OTHER PUBLICATIONS

Ion Transport in Solids Under Conditions Which Include Large Electric Fields; M.J. Dignam; Pergamon Press 1968 vol. 29, pp. 249–260.

The Photo–Erasable Memory Switching Effect of Ag Photo–Doped Chalcogenide Glasses; Isamu Shimizu, Hiroshi Kokado, and Eiichi Inoue; Bulletin of the Chemical Society of Japan, Vol. 46No. 12; pp. 3662–3665 (1973).

Polarity–dependent Memory Switching and Behavior of Ag Dendrite in Ag–Photodoped Amorphous As2S3 Films; Yooichi Hirose and Haruo Hirose; Department of Electrical Engineering, Nippon Institute of Technology, Miyashiro, Minami–Saitama Saitama 345, Japan; pp. 2767–27721.

High Speed Memory Behavior and Reliability of an Amorphous As2S3 Film Doped with Ag: Y. Hirose, H. Hirose and M. Morisue; Department of Electrical Engineering, Nippon Institute of Technology, Saitama; pp. K187–K190; 1980.

A Study on the Nanvolatile Memory Effect of Amorphous As253 Film Utilizing Photodoping Method; Hong–Bay Chung, Young–Ho Kim, and Byong–Kyu Shin; Journal of the Electric Society (Korea), vol. 34, #6, pp. 238–243, Jun. 1985.

Mechanism of Photosurface Deposition; T. Kawaguchi, S. Maruno, and K. Tanaka, Journal of Non–Crystalline Solids 164–166 (1993).

Equivalent Circuit Modeling of the Ag/Aso–24So.36Ag9.40/Ag System Prepared by Photodissolution of Ag; Appearing in the Journal of the Electrochemical Society; vol. 145, N. 9, Sep. 1998.

The Programmable Metallization Cell—Potential Applications in Critical Electronic Systems; Appearing in the Proceedings of the 1998 International Conference on Integrated Nano/Microtechnology for Space Applications; Paper Presented at the Nasa/Saic Sponsored Nanospace 98 Conference, Houston, Texas, Nov. 1–6, 1998.

Polarity–dependent Memory Switching Effects in the Ti CdxPb1–xS AG System; HM Upadhyaya and S. Chandra; Department of Physics, Barnaras Hindu University, Varanasi 221005, India; published on Nov. 14, 1994; Semicond. Sci. Technology. 10 (1995) 332–338.

Electronic Memory Switching in a New Charge Transfer–Complex Thin Film; K.Z. Wang, Z.Q. Xue, M. Ouyang, H.XX. Zhang; Solid State Communications, vol. 96, No. 7, pp. 481–484, 1995.

Programmable Current Mode Hebbian Learning Neural Network Using Programmable Metallization Cell; B. Swaroop, W.C. West, G. Martinez, M.N. Kozicki, and L.A. Akerst; Center for Solid State Electronics Research; Arizona State University; Tempe, Arizona; Division of Engineering; University of Texas at San Antonio; San Antonio, Texas; as presented at ISCAS '98; The International Symposium on Circuits and Systems; May 31–Jun. 3, 1998; Hosted by the Naval Postgraduate School.

Diffusion–limited Aggregation; T.A. Witten; Exxon Research and Engineering Company, Linden, New Jersey 07036; Physical Review B; vol. 27, No. 9; May 1, 1983.

Pattern Selection in Dendriteic Solidification; E. Ben Jacob, Nigel Goldenfeld, B.G. Kortliar and J.S. Langer; Physical–Review Let RS; vol. 53, No. 2; Nov. 26, 1984.

Electrochemical Aspects of the Generation of Ramified Metallic Electrodeposits; J.N. Chazalviel; Physical Review A; vol. 42, No. 12; Dec. 15, 1990.

Electrochemical Growth of Single Metal and Alloy Clusters—Part 1. Galvanostatic Conditions; Dectrochimice Acid, vol. 38, No. 4, pp. 535–539; 1993.

2D and 3D Thin Film Formation and Growth Mechanisms in Metal Electrocrystallization—an Atomistic View by in Situ STM; W.J. Lorenz and G. Stalkov; Surface Science 335; pp. 32–43 (1995).

Growth Rate of Fractal Cooper Electrodeposits: Potential and Concentration Effects; J.M. Costa, F. Safues, and M. Vilarrasa; Physical Review A; vol. 43, No. 12 (1991).

Electrochemically Controlled Growth and Dissolution of Silver Whiskers; J. Corish, C.D. O'Brian; Journal of Materials Science; 6 (1971) 252–259.

Metal Photosurface Deposition in As–S–Ag Glasses; Shigeo Maruno and Takeshi Kawaguchi; Journal of Applied Physics, vol. 46, No. 12, Dec. 1975; 5312–5314.

Photo–induced Structural and Physico–Chemical Changes in Amorphous Chalcogenide Semiconductors; A.E. Owen, A.P. Firth and P.J.S. Ewen; Philoosophical Magazine B. vol. 52, No. 3 (1985); pp. 347–362.

* cited by examiner

PROGRAMMABLE SUB-SURFACE AGGREGATING METALLIZATION STRUCTURE AND METHOD OF MAKING SAME

CROSS REFERENCE TO RELATED APPLICATIONS

This application claims the benefit of Provisional Application Ser. No. 60/067,509, filed Dec. 4, 1997, to PCT application Ser. No. PCT/US/25830, filed Dec. 4, 1998, and to application Ser. No. 09/228,727, filed Jan. 12, 1999, which issued as U.S. Pat. No. 6,084,796, which is a continuation of application Ser. No. 09/004,041, which is a division of application Ser. No. 08/652,706, filed May 30, 1996, which issued as U.S. Pat. No. 5,761,115.

BACKGROUND OF THE INVENTION.

1. Technical Field

The present invention generally relates to programmable metallization structures, and more particularly, to a programmable sub-surface aggregating metallization ("PSAM") structure including an ion conductor, a plurality of electrodes and a voltage-controlled metal structure or dendrite formed through the ion conductor between the electrodes.

2. Description of the Related Art

The present invention claims the benefit of U.S. Provisional Application No. 60/067509, filed Dec. 4, 1997.

Memory Devices

Memory devices are used in electronic systems and computers to store information in the form of binary data. These memory devices may be characterized into various types, each type having associated with it various advantages and disadvantages.

For example, random access memory ("RAM") which may be found in personal computers is volatile semiconductor memory; in other words, the stored data is lost if the power source is disconnected or removed. Dynamic RAM ("DRAM") is particularly volatile in that it must be "refreshed" (i.e., recharged) every few microseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off.

CD-ROM is an example of non-volatile memory. CD-ROM is large enough to contain lengthy audio and video segments; however, information can only be read from and not written to this memory. Thus, once a CD-ROM is programmed during manufacture, it cannot be reprogrammed with new information.

Other storage devices such as magnetic storage devices (i.e., floppy disks, hard disks and magnetic tape) as well as other systems, such as optical disks, are non-volatile, have extremely high capacity, and can be rewritten many times. Unfortunately, these memory devices are physically large, are shock/vibration-sensitive, require expensive mechanical drives, and may consume relatively large amounts of power. These negative aspects make these memory devices non-ideal for low power portable applications such as lap-top and palm-top computers and personal digital assistants ("PDAs").

Due to the rapidly growing numbers of compact, low-power portable computer systems in which stored information changes regularly, read/write semiconductor memories have become widespread. Furthermore, because these portable systems require data storage when the power is turned off, a non-volatile storage device is required. The simplest programmable semiconductor non-volatile memory devices in these computers are programmable read-only memory ("PROM"). The most basic PROM uses an array of fusible links; once programmed, a PROM cannot be reprogrammed. This is an example of a write-once read-many ("WORM") memory. The erasable PROM ("EPROM") is alterable, but each rewrite must be preceded by an erase step involving exposure to ultra violet light. The electrically erasable PROM ("EEPROM" or "E²PROM") is perhaps the most ideal of conventional non-volatile semiconductor memory, as it can be written to many times. Flash memories, another type of EEPROM, have higher capacity than the low density, traditional EEPROMs but lack their endurance. One major problem with EEPROMs is that they are inherently complex. The floating gate storage elements that are used in these memory devices are difficult to manufacture and consume a relatively large amount of semiconductor real estate. Furthermore, the circuit design must withstand the high voltages necessary to program the device. Consequently, an EEPROM's cost per bit of memory capacity is extremely high compared with other means of data storage. Another disadvantage of EEPROMs is that although they can retain data without having the power source connected, they require relatively large amounts of power to program. This power drain can be considerable in a compact portable system powered by a battery.

Accordingly, in view of the various problems associated with conventional data storage devices described above, it is highly desirable to have a read/write memory technology and device which is inherently simple and inexpensive to produce. Furthermore, this memory technology should meet the requirements of the new generation of portable computer devices by operating from a low voltage while providing high storage density, non-volatility, and a low manufacturing cost.

Programmable Passive and Active Components

Electronic circuits may include literally millions of component parts. These component parts generally fall into two distinct categories, namely, passive components and active components. Passive components, such as resistors and capacitors, have electrical values associated with them which are relatively constant. On the other hand, some electrical characteristics of active components, such as transistors, are designed to change in response to an applied voltage or current.

Because of the extensive use of these two types of components, it is highly desirable to have a low-cost device which may perform both the functions of a passive component and an active component. For example, it would be highly desirable to have a device that acts as an active component which responds to an applied signal by altering its resistance and capacitance and yet, in an alternate embodiment, acts as a passive component which can be pre-programmed (i.e., the change is "remembered" by the device after programming is complete). Such a device would be used in many diverse applications from tuned circuits in communications equipment to volume controls in audio systems.

Because of the widespread use of devices such as memory devices, and programmable resistor and capacitor devices, it is very desirable to have a low cost, easy to manufacture device that may be implemented in all of these various applications, among others.

SUMMARY OF THE INVENTION

In accordance with an exemplary embodiment of the present invention, a programmable sub-surface aggregating metallization ("PSAM") structure includes an ion conductor such as a chalcogenide-glass which includes metal ions and at least two electrodes (e.g., an anode and cathode) each having an electrically conducting material and disposed at opposing surfaces of the ion conductor. Chalcogenide materials as referred to herein include any compound including sulfur, selenium and/or tellurium. In an exemplary embodiment, the ion conductor is a composition formed from a chalcogenide and at least one Group 1 or Group II metal (most preferably, arsenic trisulphide-silver). The anode and cathode are each formed from any suitable conducting material, and the anode preferably contains some silver.

When a voltage is applied between the anode and cathode, a metal dendrite grows from the cathode through the ion conductor towards the anode. The growth rate of the dendrite may be stopped by removing the voltage or the dendrite may be retracted back towards the cathode by reversing the voltage polarity at the anode and cathode. When a voltage is applied for a sufficient length of time, a continuous metal dendrite grows through the ion conductor and connects the electrodes, thereby shorting the device. The continuous metal dendrite then can be broken by applying another voltage. The break in the metal dendrite can be reclosed by applying yet another voltage. Changes in the length of the dendrite or the presence of a break in the dendrite affect the resistance, capacitance, and impedance of the PSAM.

BRIEF DESCRIPTION OF THE DRAWING FIGURES

The subject matter of the invention is particularly pointed out and distinctly claimed in the concluding portion of the specification. The invention, however, may best be understood by reference to the following description taken in conjunction with the claims and the accompanying drawing, in which like parts may be referred to by like numerals:

DETAILED DESCRIPTION OF EXEMPLARY EMBODIMENTS

The ensuing descriptions are exemplary embodiments only, and are not intended to limit the scope, applicability, or configuration of the invention in any way. Rather, the ensuing description provides a convenient illustration for implementing exemplary embodiments of the invention. In this regard, various changes may be made in the function and arrangement of elements described in the exemplary embodiments without departing from the spirit and scope of the invention as set forth in the appended claims.

Figure 1A:
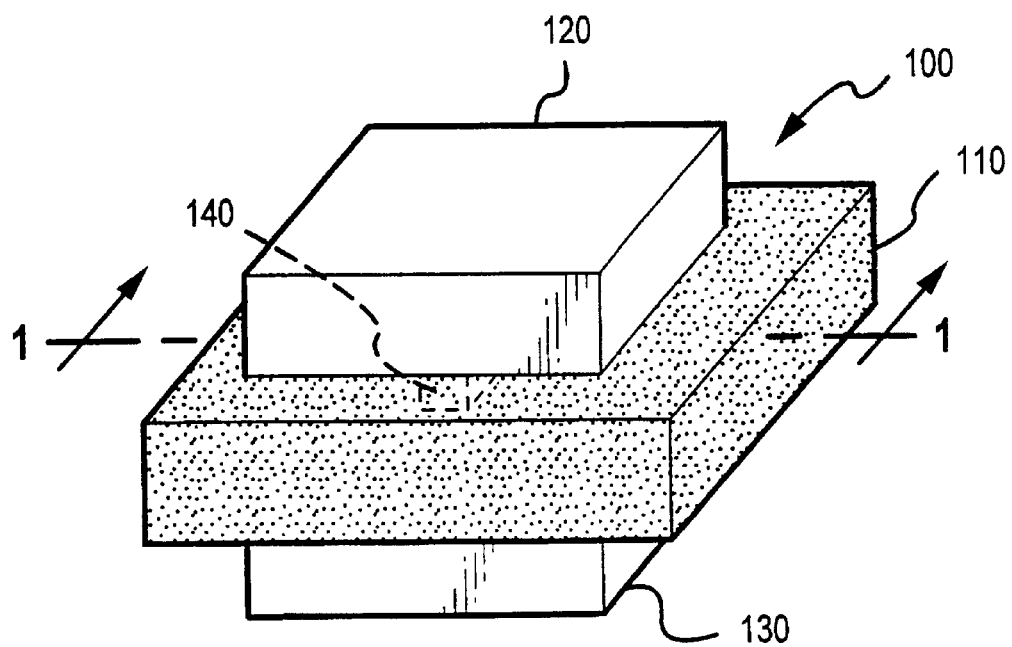
FIG. 1A is a perspective view of an exemplary programmable sub-surface aggregating metallization structure configured in accordance with various aspects of the present invention.
Figure 1B:
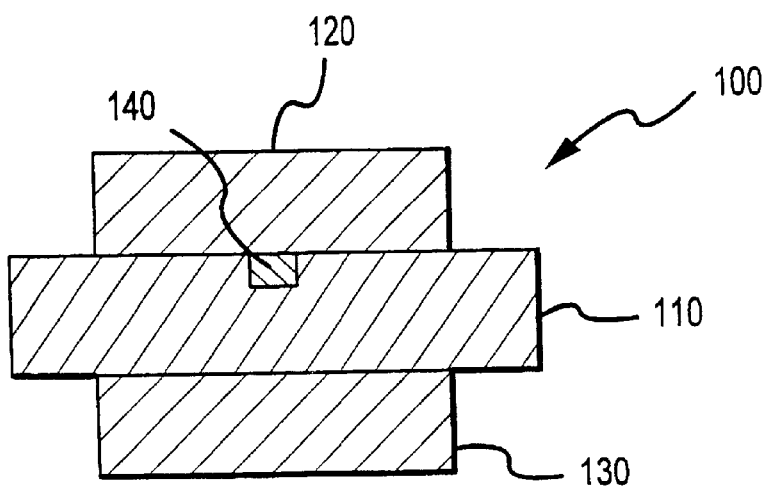
FIG. 1B is a cross-sectional view of FIG. 1A taken from line 1—1.

With reference to FIGS. 1A and 1B, a programmable sub-surface aggregating metallization ("PSAM") structure 100 in accordance with various aspects of the present invention is illustrated. In an exemplary embodiment of the present invention, the PSAM structure 100 preferably includes an ion conductor 110 and a plurality of electrodes 120 and 130 disposed on the surfaces of ion conductor 110.

The ion conductor 110 of the PSAM structure 100 may include a solid electrolyte, a metal ion-containing glass, a metal ion-containing amorphous semiconductor, a chalcogenide-glass which includes metal ions, or the like. In the broadest sense, in accordance with various aspects of the present invention, a chalcogenide material includes any compound containing sulfur, selenium and/or tellurium, whether ternary, quaternary or higher compounds. In an exemplary embodiment, the ion conductor 110 is formed from a chalcogenide-glass which includes a metal ion composition, while the metal may be selected from various Group I or Group II metals (preferably, silver, copper, zinc or a combination thereof).

The ion conductor 110 which includes a metal ion composition may be obtained using any convenient method. For example, in an exemplary embodiment of the present invention, ion conductor 110 is preferably formed from arsenic trisulphide-silver ("$As_2S_3$—Ag") using photodissolution. The silver is suitably introduced into the $As_2S_3$ by illuminating a thin silver film and the $As_2S_3$ layer with light of appropriate wavelength, such as wavelength less than about 500 nanometers (nm). The silver and $As_2S_3$ bilayer are exposed under the light until an appropriate saturation level is reached, approximately 45 atomic percent of silver to $As_2S_3$. The thickness of the ion conductor 110 may vary from a few nanometers to few hundreds of nanometers.

The electrodes 120 and 130 are suitably arranged apart from each other at the surfaces of ion conductor 110. The electrodes 120 and 130 may be formed from any electrically conducting material that will produce an electric field for the transport of metal ions in the ion conductor 110. In an exemplary embodiment, the electrodes 120 and 130 are formed from material containing silver.

When an appropriate voltage is applied between the electrodes 120 and 130, a metal dendrite 140 grows from the electrode 120 (i.e. the cathode, the electrode connected to the negative pole of the power supply) through the ion conductor 110 toward the electrode 130 (i.e., the anode). It should be appreciated that the polarity of electrodes 120 and 130 may be reversed prior to the growth of the metal dendrite 140, in which case the metal dendrite 140 will grow from the electrode 130 (now the cathode) toward the electrode 120 (now the anode). As will be discussed in greater detail below, if the polarity of electrodes 120 and 130 are reversed when the metal dendrite 140 has already started to grow from the electrode 120 (the cathode) to electrode 130 (the anode), then metal dendrite 140 will retract back toward electrode 120.

The metal dendrite 140 may be allowed to grow entirely through the ion conductor 110 until it meets the electrode 130, thereby completing the electrical circuit. Alternatively, the metal dendrite 140 may be halted before it reaches the electrode 130 by stopping the applied voltage. As long as the metal dendrite 140 does not touch the electrode 130, its growth can be easily stopped and retracted by reversing the applied voltage at electrodes 120 and 130.

Additionally, the growth rate of the metal dendrite 140 is a function of the applied voltage, device geometry, and time; thus, low voltages result in relatively slow growth whereas higher voltages result in relatively rapid growth. The growth and changes in the length of the metal dendrite 140 described above affect the electrical characteristic (e.g., the resistance, the capacitance, and the like) of the PSAM structure 100, which may then be suitably detected using any convenient detection circuitry. Once the metal dendrite 140 has grown to a particular length, the metal dendrite 140 remains intact when the voltage is removed from electrodes 120 and 130. Therefore, the changes in the electrical characteristic of the PSAM structure 100 which results from the changes in the length of the metal dendrite 140 is also non-volatile.

Having thus described the basic structure of one possible exemplary embodiment, the following description and related figures more particularly describe and depict the operation of another possible exemplary embodiment of the present invention. With reference to FIGS. 2A through 2D, a programmable sub-surface aggregating metallization ("PSAM") structure 200 is illustrated in accordance with various aspects of the present invention. In an exemplary embodiment, the PSAM structure 200 preferably includes an ion conductor 210 disposed between electrodes 220 and 230.

Figure 2A:
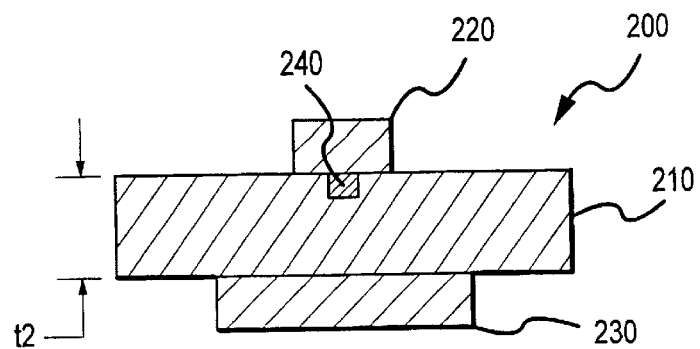
FIG. 2A–2D are cross-sectional views of another exemplary programmable sub-surface aggregating metallization structure configured in accordance with various aspects of the present invention.

Referring now to FIG. 2A, in accordance with one aspect of the present invention, a conditioning pulse with a high voltage set point and a low current limit is applied between electrodes 220 and 230 of PSAM structure 200. In an exemplary embodiment, electrodes 220 and 230 are suitably configured as a cathode and an anode, respectively. Thus, a nonvolatile metal dendrite 240 grows from electrode 220 (cathode) through ion conductor 210 toward electrode 230 (anode).

Figure 2B:
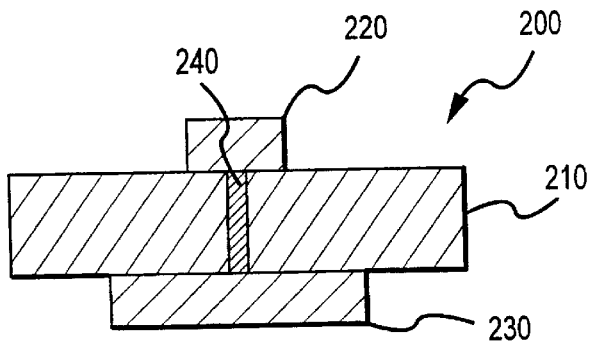
Figure 2C:
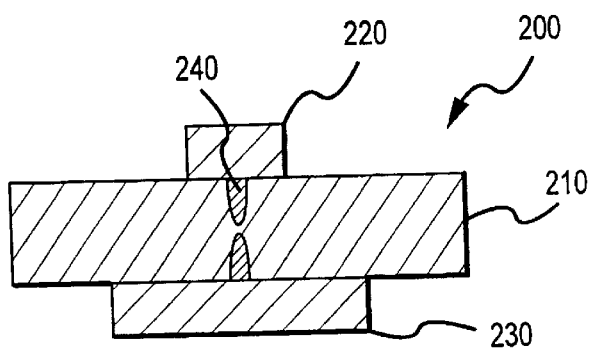

Referring now to FIG. 2B, in accordance with another aspect of the present invention, the nonvolatile metal dendrite 240 grows entirely through ion conductor 220 and contacts electrode 230 when the conditioning pulse is applied to electrode 220 of PSAM structure 200 for a sufficiently long enough period of time. The length of time required depends in part on the voltage of the conditioning pulse and the geometry of the PSAM structure 200. For example, if thickness t2 of the ion conductor 210 is thin, about 10 nm to about 50 nm, and the conditioning pulse is about 1 V, then approximately 50 μsec is required to grow the nonvolatile metal dendrite 240 entirely through the ion conductor 220. If the conditioning pulse is about 5 V, however, then approximately 2 μsec is required to grow the nonvolatile metal dendrite 240 entirely through the ion conductor 220. It will be appreciated that various voltages, dimensions, and therefore lengths of time required are possible. voltage limit is suitably applied between electrode 220 and electrode 230 of the PSAM structure 200. The erase pulse is forward biased, meaning that the polarity of electrode 220 and electrode 230 need not be reversed. The erase pulse breaks the metal dendrite 240 resulting in a gap within the metal dendrite 240. The existence of the gap within the metal dendrite 240 alters the electrical characteristics (e.g., impedance) of the PSAM structure 200. Pulses at very small voltages (e.g., less than about 300 mV) typically do not promote dendrite growth; therefore, the state of the dendrite may be suitably detected (read) by using a short low current pulse.

Figure 2D:
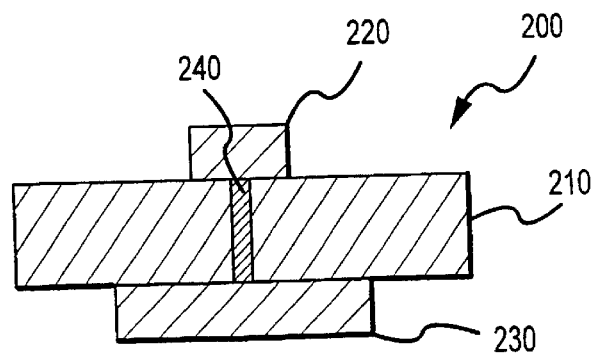

Referring now to FIG. 2D, in accordance with yet another aspect of the present invention, a write pulse with a relatively high voltage set point and a relatively low current limit is suitably applied to electrodes 220 and 230 of the PSAM structure 200 to reclose the gap in the metal dendrite 240. Thus, the PSAM structure 200 can be erased, read, and written by suitably applying different unipolar voltage pulses. Alternative, the PSAM structure 200 also can be erased, read, and written in various directions, thus offering considerable operational flexibility. For example, the PSAM structure 200 can be erased with a forward bias pulse, read with a reverse bias pulse, then written with a forward bias pulse, or various other combinations.

In the above description, pulses with high or low voltage set points and high or low current limits were described. It should be appreciated that the specific high and low levels of the voltage set points and current limits may vary greatly depending on the specific configuration and dimensions of the PSAM structure. In general, a low voltage set point refers to voltage set points which are sufficiently low to prevent the growth of a metal dendrite. Accordingly, a high voltage set point refers to voltage set points which promote the growth of a metal dendrite. A high current limit refers to current limits which are sufficiently high to form a gap in a metal dendrite which has grown between the electrodes. Accordingly, a low current limit refers to current limits which are sufficiently low to keep the metal dendrite intact. The specific current limit at which a gap in the metal dendrite can be formed will depend in part on the thickness of the metal dendrite. For example, a gap in a thin metal dendrite may be formed with a current limit of a few nano-amps, whereas a gap in a thick metal dendrite may be formed with a current limit of a few micro-amps.

Figure 3A:
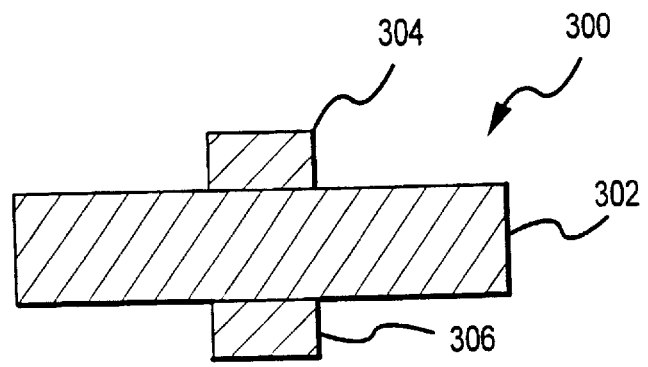
FIG. 3A–3F are cross-sectional views of various alternative configurations of programmable sub-surface aggregating metallization structures configured in accordance with various aspects of the present invention.
Figure 3B:
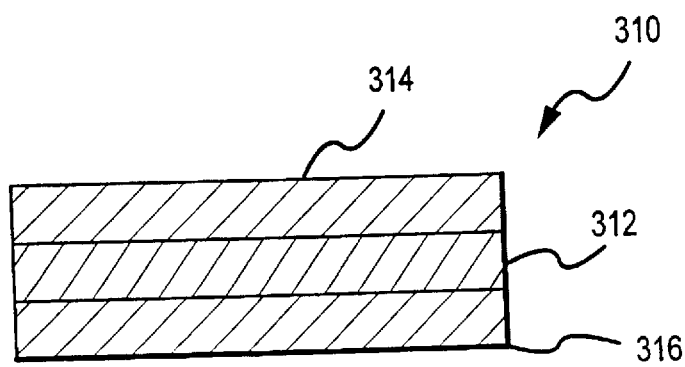
Figure 3C:
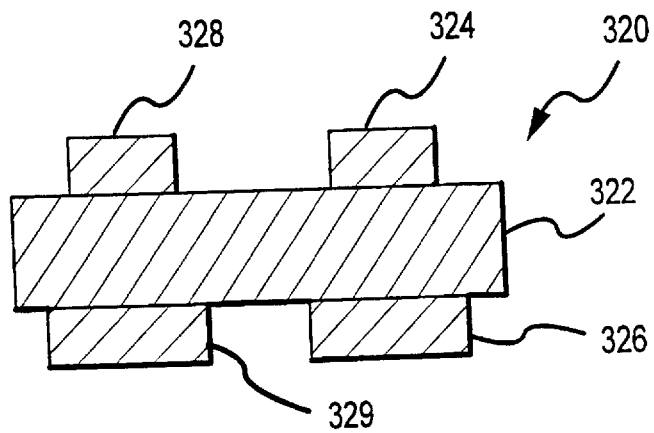
Figure 3D:
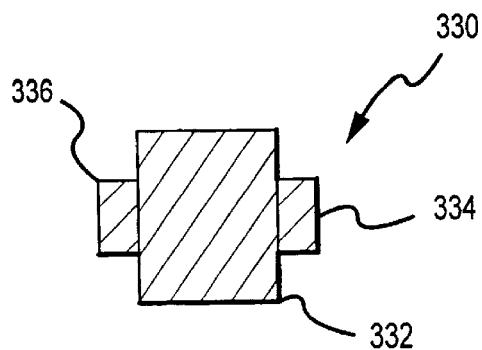
Figure 3E:
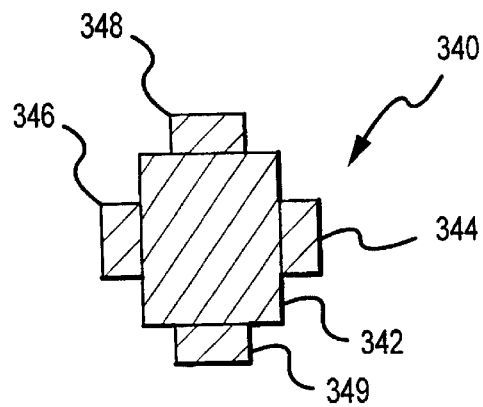
Figure 3F:
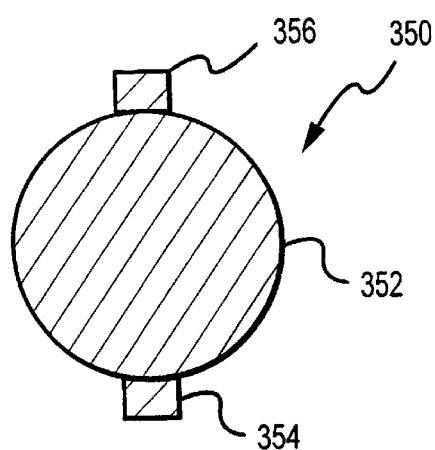

Although thus far the exemplary embodiments of the present invention have been described and depicted as being substantially vertical in configuration, various alternative configurations and arrangements are possible without departing from the spirit and scope of the invention. For example, referring now to FIGS. 3A through 3F, various alternative configurations of the present invention are shown. More particularly, with reference to FIG. 3A, in one alternative configuration, a PSAM structure 300 preferably includes ion conductor 302 and electrodes 304 and 306. In accordance with this configuration, the electrodes 304 and 306 are preferably smaller than the ion conductor 302. With reference to FIG. 3B, in another alternative configuration, a PSAM structure 310 preferably includes ion conductor 312 and electrodes 314 and 316. In accordance with this configuration, the electrodes 314 and 316 are preferably substantially the same size as the ion conductor 312. With reference to FIG. 3C, in still another configuration of the present invention, a PSAM structure 320 preferably includes ion conductor 322 and multiple pairs of electrodes 324, 326, 328 and 329. With reference to FIG. 3D, in yet another configuration of the present invention, a PSAM structure 330 preferably includes ion conductor 332 and electrodes 334 and 336. In this configuration, the electrodes 334 and 336 are suitably disposed along a horizontal orientation on the ion conductor 332. With reference to FIG. 3E, in another alternative configuration of the present invention, a PSAM structure 340 preferably includes a ion conductor 342 and multiple pairs of electrodes 344, 346 and 348, 349 suitably in a plurality of dimensions on the ion conductor 342. With reference to FIG. 3F, in still another alternative configuration of the present invention, a PSAM structure 350 preferably includes a spheric ion conductor 352 and electrodes 354 and 356. Although in this configuration the ion conductor 352 is depicted as being spheric in shape, the ion conductor 352 may be configured as various other non-conventional geometries. Additionally, it should be appreciated that the above described alternative configurations can all be extended to 3 dimensional structures. For example, an ion conductor can be configured as a block with a plurality of electrodes attached at some or all of the faces.

Figure 4A:
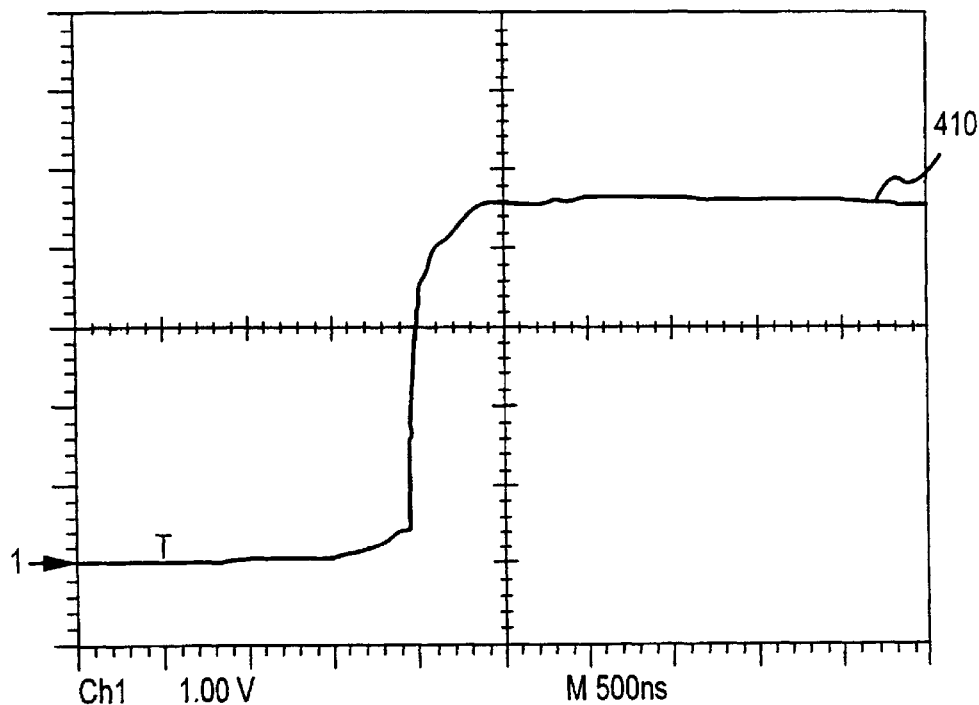
FIG. 4A is a graphic representation showing the relationship between current and time in an exemplary embodiment of the present invention.
Figure 4B:
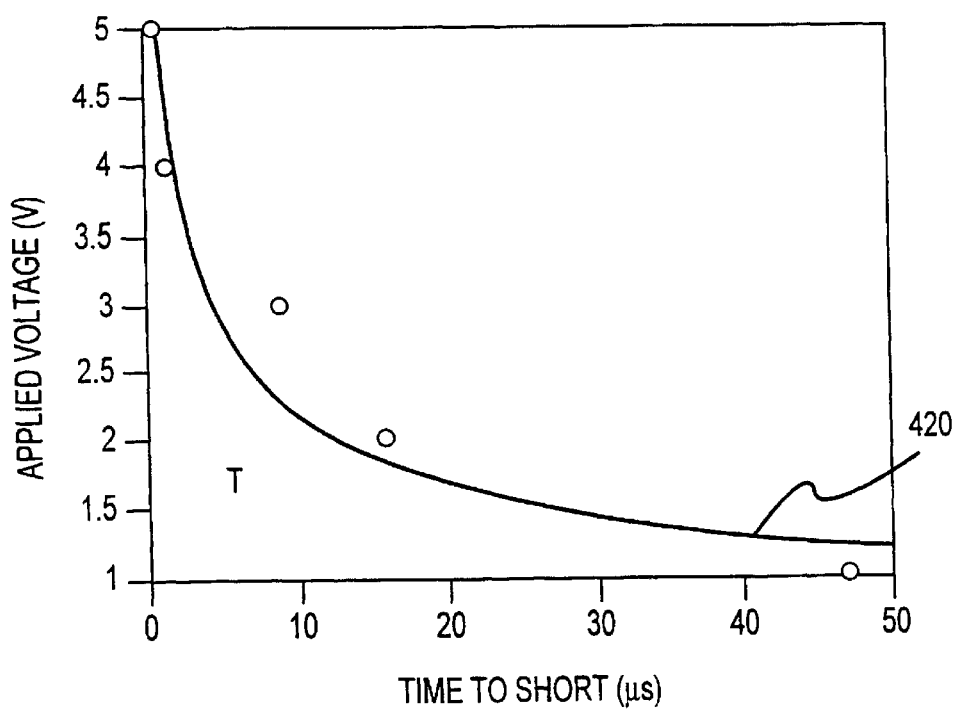
FIG. 4B is a graphic representation showing the relationship between applied voltage and time to short in an exemplary embodiment of the present invention.
Figure 4C:
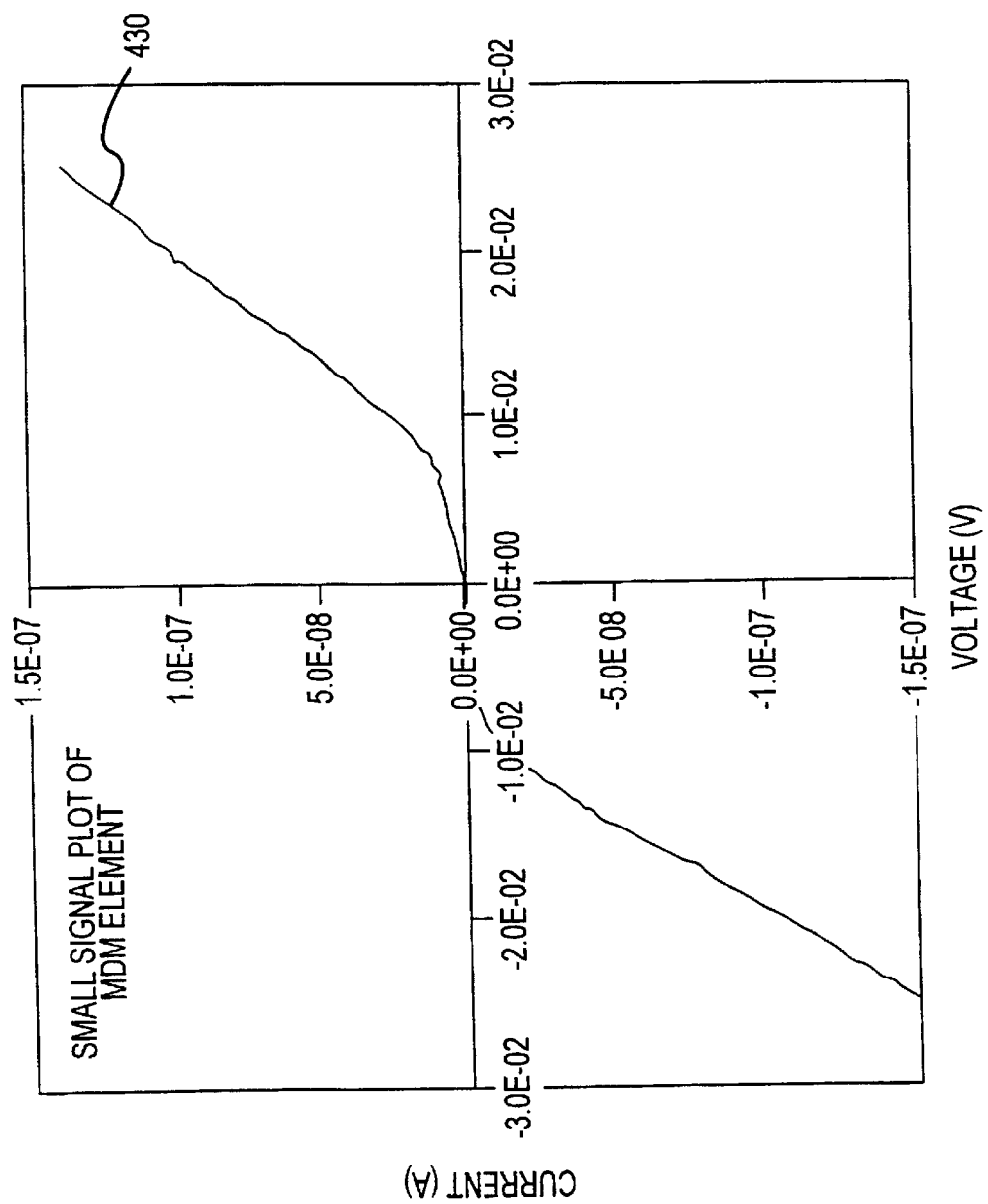
FIG. 4C is a graphic representation showing the relationship between current and voltage in an exemplary embodiment of the present invention.

Referring now to FIGS. 4A and 4B, graphic representations show the relationship in an experimental PSAM structure between voltage and time and applied voltage and time to short, respectively. The PSAM structure used to obtain these results has an ion conductor thickness of about 120 nm and configured substantially similar to the embodiment illustrated in FIGS. 1A and 1B. It should be noted, however, that the specific embodiment described herein are merely exemplary and that the present invention is not limited to any particular configuration. With reference to FIG. 4A, a curve 410 represents the relationship between voltage and time of the PSAM structure. When a voltage of 5 V is applied, the PSAM structure shorts in approximately 2 $\mu$secs. With reference to FIG. 4B, a curve 420 represents the relationship between applied voltage and time to short the PSAM structure. The amount of time required to grow a dendrite completely through the ion conductor and connect the electrodes, thereby shorting the PSAM structure, increases as the applied voltage decreases. Referring now to FIG. 4C, a curve 430 represents the relationship between current and voltage of an unshorted PSAM structure. The small-signal "Butler-Volmer" characteristics of the device indicates that there is very little Faradaic current at very small bias; therefore, at bias less than 10 mV there is little dendrite growth. This characteristic of the PSAM structure permits the state of the dendrite to be read using a unipolar pulse without disturbing the state of the dendrite.

A PSAM structure according to various aspects of the present invention is particularly suited for use in connection with memory devices such as programmable read only memory ("PROM") devices, electrically erasable PROM ("EEPROM") devices, and the like. Additionally, the present invention is particularly suited for use in connection with programmable resistance and capacitance devices. As a result, exemplary embodiments of the present invention will be described below in that context. It should be recognized, however, that such description is not intended as a limitation on the use or applicability of the present invention, but is instead provided to enable a full and complete description of exemplary embodiments.

Metal Dendrite Memory

As described above, a PSAM structure may be used for implementing various different technologies such as memory devices. Accordingly, with reference to FIG. 5A, a metal dendrite memory ("MDM") 500 in accordance with various aspect of the present invention is shown. In an exemplary embodiment of the present invention, the MDM 500 preferably includes a substrate 510 which provides the physical support for the memory cell or device. If the substrate 510 is non-insulating or otherwise incompatible with the materials used in the MDM 500, an insulator 520 is suitably disposed on the substrate 510 to isolate the active portion of the MDM 500 from the substrate 510. Next, a bottom electrode 530 is suitably deposited and patterned on the substrate 510 (or the insulating layer 520 if an insulator is used). Next, an ion conductor 540 is suitably deposited and patterned over the bottom electrode 530 and the substrate 510 (or the insulating layer 520 if an insulator is used). Next, a dielectric film 550 is preferably deposited over the ion conductor 540 and vias are opened over a portion of the ion conductor 540 and the bottom electrode 530 layers. Finally, a top electrode 560 is suitably deposited and patterned in the vias. Suitable interconnects to bottom electrode 530 and top electrode 560 are provided using any convenient method which is well known, for example, in the semiconductor integrated circuit industry.

When an appropriate voltage is applied between the top electrode 560 (cathode) and the bottom electrode 530 (anode), a nonvolatile metal dendrite 570 grows through the ion conductor 540 toward the bottom electrode 530 (anode). Similar to the PSAM structures described above, the growth and changes in the length of the nonvolatile metal dendrite 570 affects the electrical characteristics (e.g., the resistance, the capacitance, and the like) of the MDM 500. In this manner, as will be described in greater detail below, the MDM 500 can be utilized as various memory devices.

The MDM 500 also can be appropriately patterned to provide isolation from multiple adjacent MDM devices. For example with reference to FIG. 5B, a suitable amorphous silicon diode 562, such as a Schottky or p-n junction diode, may be configured between the bottom electrode 560 and the ion conductor 540. Additionally, a dielectric film can be deposited over the top electrode 560 and the entire structure can be repeated. Thus, with reference to FIG. 5C, rows and columns of MDM devices 500 may be fabricated into a high density configuration to provide extremely large storage densities. In general, the maximum storage density of memory devices can be limited by the size and complexity of the column and row decoder circuitry. However, the MDM storage stack can be suitably fabricated overlying an integrated circuit with the entire semiconductor chip area dedicated to row/column decode, sense amplifiers, and data management circuitry (not shown) since the MDM elements will not use any silicon real estate. In this manner, storage densities of many Gb/cm$^2$ can be attained using MDM devices. Utilized in this manner, the MDM is essentially an additive technology that adds capability and functionality to existing silicon integrated circuit technology.

It should be recognized that there are various alternative configurations or methods for constructing an MDM device in accordance with the present invention. For example with reference to FIG. 6, in an alternative configuration in accordance with various aspects of the present invention, an MDM 600 is illustrated in which a dielectric film 650 is preferably deposited over a bottom electrode 630 and a substrate 610 (or an insulating layer 620 if an insulator is used). Vias may be opened over a portion of the bottom electrode 630. An ion conductor 640 may be deposited and patterned over the bottom electrode 630 within the vias. Next, a top electrode 660 may be deposited and patterned in the vias.

Figure 5A:
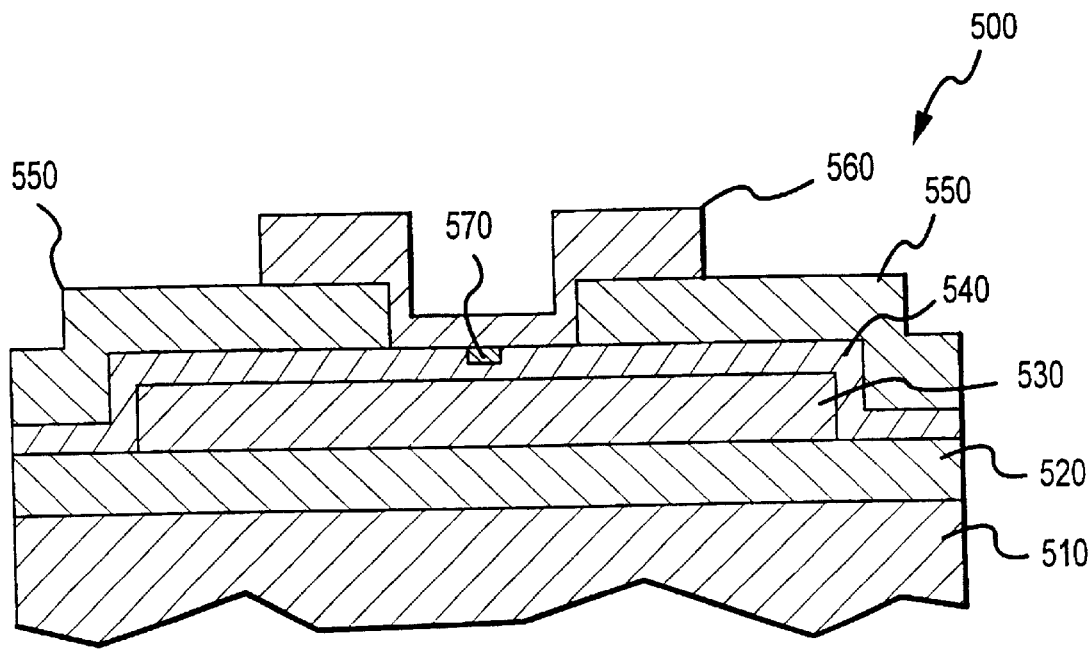
FIG. 5A is a cross-sectional view of an exemplary memory device in accordance with various aspects of the present invention.
Figure 5B:
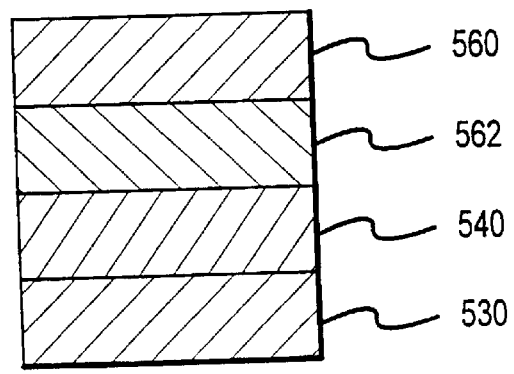
FIG. 5B is a cross-sectional view of a portion an alternative configuration of the exemplary memory device illustrated in FIG. 5A.
Figure 5C:
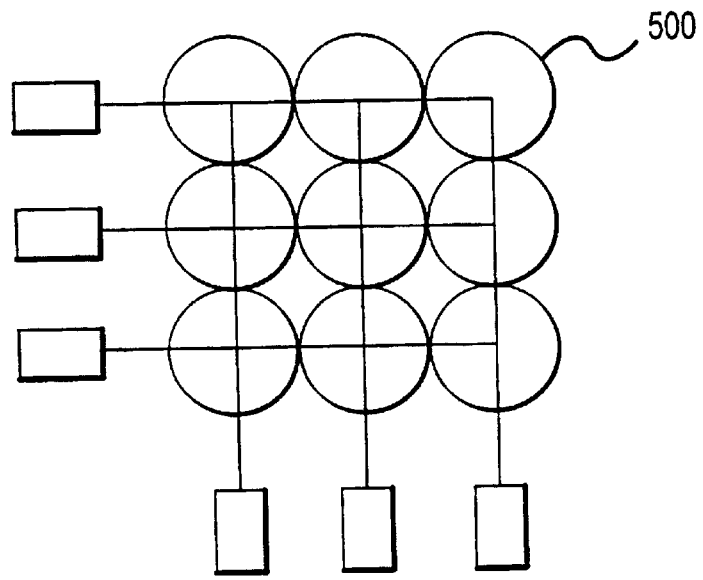
FIG. 5C is a schematic of a network of memory devices in accordance with various aspects of the present invention.
Figure 6:
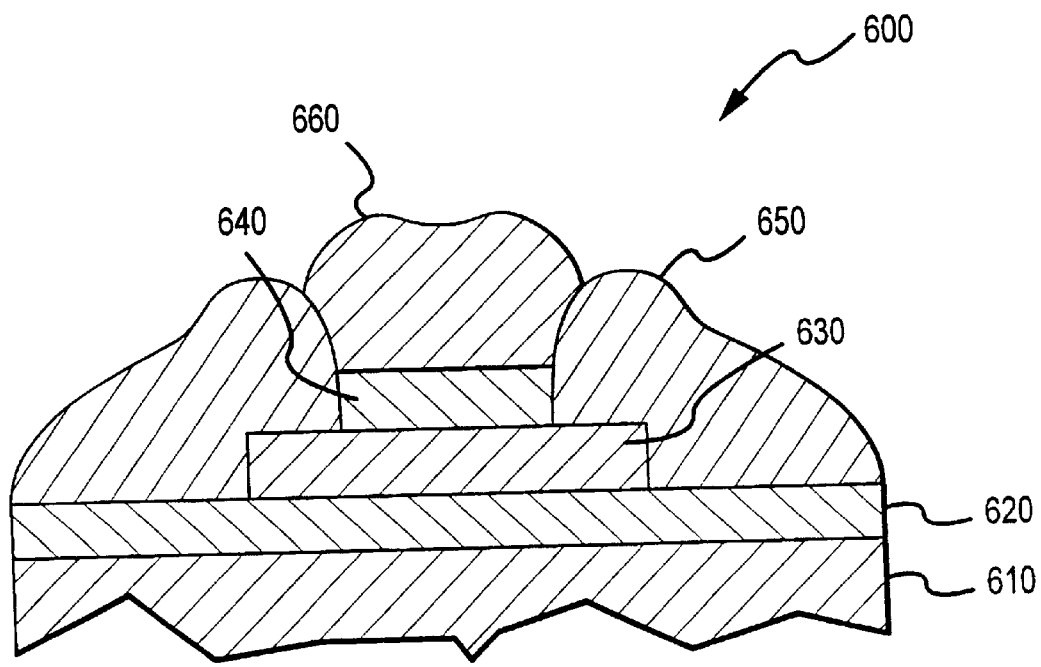
FIG. 6 is a cross-sectional view of another exemplary memory device in accordance with various aspects of the present invention.
Figure 7:
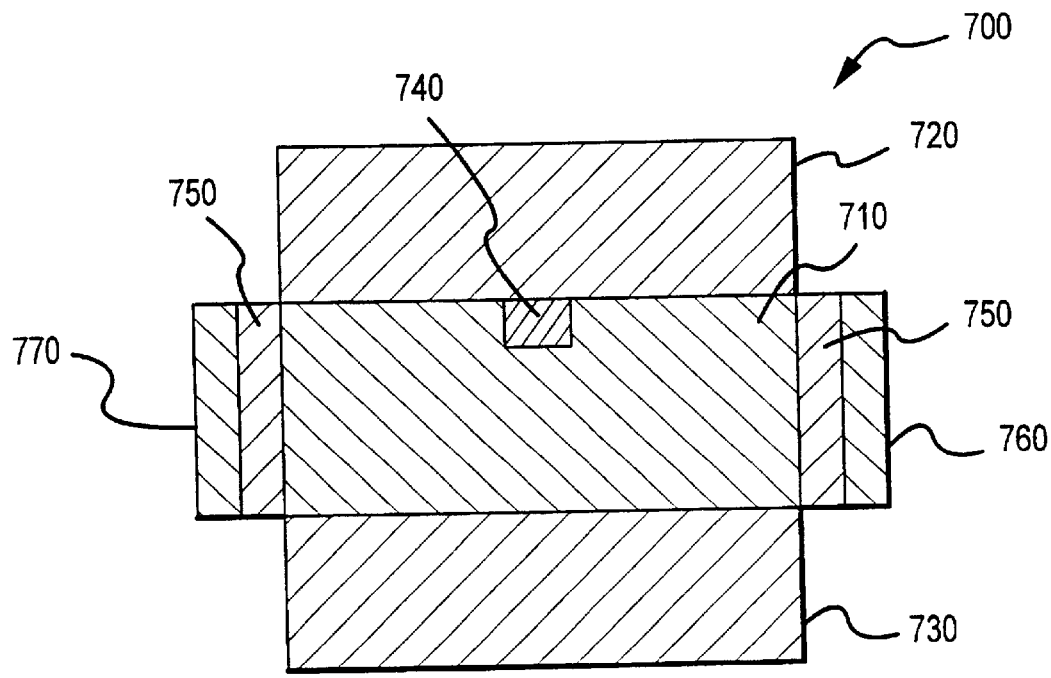
FIG. 7 is a cross-sectional view of an exemplary programmable resistance/capacitance device in accordance with various aspects of the present invention.

Turning now to FIG. 7, the illustrated device is similar to the memory cell or metal dendrite memory cell of FIGS. 5A and 6, however, additional electrodes are provided. Specifically, an MDM 700 includes an ion conductor 710 and electrodes 720 and 730 disposed at the surface of the ion conductor 710. When an appropriate voltage is applied to the electrode 720 (cathode), a dendrite 740 grows through the ion conductor 710 towards the electrode 730 (anode).

In accordance with one aspect of the present invention, the MDM 700 also includes two additional electrodes 760 and 770. Electrodes 760 and 770 are separated from ion conductor 710 by a material 750, which can be either a dielectric or resistive material. In the case of a dielectric material, the MDM 700 will exhibit programmable capacitance between the various electrodes. In the case of a resistive material, the MDM 700 will exhibit programmable resistances between the various electrodes. The programmable capitances or resistances between the various electrodes are preferably programmed by the extent of growth of the metal dendrite 740.

The MDM 700 offers several advantages over the MDM 500 and MDM 600 shown in FIG. 5A and 6 configured with two electrodes. For example, one such advantage is that a voltage can be applied to any combinations of the electrodes other than electrodes 720 and 730 without altering the length of metal dendrite 740 and therefore the capacitance and/or resistance of the device. This has important implications for the use of the MDM 700 in memory arrays and other electronic circuit applications. These same considerations and advantages apply to a three electrode rather than a four electrode device. It should be appreciated that in this particular exemplary embodiment the metal dendrite 740 grows between electrodes 720 and 730 and not between any of the other electrodes. Therefore, electrodes 720 and 730 are the programming terminals of the MDM 700, with the other electrodes being the output terminals of the MDM 700.

The exemplary MDMs of FIGS. 5A, 6 and 7 represent a significant departure from conventional silicon-based microelectronics. In fact, silicon is not required for the operation of the MDM unless control electronics are to be incorporated on the same chip. Also, the overall manufacturing process of an MDM is considerably simpler than even the most basic semiconductor processing techniques. With simple processing techniques coupled with reasonable material costs, the MDM provides a memory device with can be manufactured with a lower production cost than other memory devices.

1. PROM and Anti-fuse Applications

With reference now to FIG. 5A, in accordance with various aspects of the present invention, an MDM device can be utilized as a PROM type memory device. Most conventional PROMs use fusible links which are broken or blown during programming. Once a link is broken, it cannot be remade. The MDM device of the present invention provides the ability to make, as well as to subsequently break, a connection. This is more desirable as it gives more latitude and flexibility; for example, even if a wrong link (i.e., dendrite) is made, this link can always be blown like a conventional fuse. Also, the dendrites of the MDM device can withstand many make/break cycles; thus, multiple reprogramming cycles are possible.

The MDM device of the present invention may also be used in programmable logic arrays ("PLAs"). in PLAs, blocks of logic elements such as gates or adders are formed but are not connected. The connections are made to suit a particular low volume application (e.g., an application which would not justify a custom chip design). Traditionally, the final connections between the various logic elements are made at the production facility. However, the MDM device would allow such PLA devices to be "field programmable" as it is relatively easy to electrically define hard connections between sections on the chip with the metal dendrites.

Anti-fuses are also found in integrated circuits where redundancy techniques are used to combat process-induced defects and in-service failures. For example, complex, high-density circuits such as 64 Mbyte DRAM have more memory on board the chip then is actually used. If one section of the chip is damaged during processing or fails during operation, spare memory may be brought on line to compensate. Typically, this process is controlled by logic gates on the memory chip and requires constant self-testing and electrical reconfiguration. An MDM device in accordance with the present invention may be incorporated into such memory chips to appropriately form new connections inside the chip when required.

In accordance with one aspect of the present invention, data may be written to a PROM configured MDM ("MDM-PROM") device by applying a constant or pulsed conditioning bias to the electrodes of the MDM device to promote dendrite growth. The metal dendrite is allowed to reach the anode so as to form a low resistance anti-fuse connection. This connection changes both the resistance and the capacitance of the memory system. The MDM-PROM device may then be easily "read" by passing a small current (i.e., a current small enough not to damage the dendrite) through the dendrite connection. "Erasing" the MDM-PROM device is accomplished by passing a current through the dendrite sufficiently large to break the dendrite and therefore the connection. By applying another constant or pulsed bias to the electrodes of the MDM device, the break in the dendrite can be closed.

In the MDM-PROM device, the electrical change between the two dendrite connected electrodes can be large enough that transistors are not required at the MDM cells. Thus, the memory element size becomes a function of anode/ion conductor/cathode geometry alone. This geometry allows the memory of the present invention to be the more compact than typical floating gate or ferroelectric memories which require transistors to be part of their storage elements. In addition, the MDM devices may be formed on virtually any chemically and mechanically stable substrate material; if silicon is required for additional circuitry, the MDM devices may simply be formed on a silicon substrate.

2. EEPROM Applications

With continued reference to FIG. 5A, the ability to create and control a non-volatile change in an electrical parameter such as resistance or capacitance allows the MDM of the present invention to be used in many applications which would otherwise utilize traditional EEPROM or FLASH technologies. Advantages provided by the present invention over present EEPROM and FLASH memory include, among others, lower production cost and the ability to use flexible fabrication techniques which are easily adaptable to a variety of applications. MDMs are especially advantageous in applications where cost is the primary concern, such as smart cards and electronic inventory tags. Also, the ability to form the memory directly on a plastic card is a major advantage in these applications as this is generally not possible with all other semiconductor memories.

Further, in accordance with the MDM device of the present invention, memory elements may be scaled to less than a few square microns in size, the active portion of the device being less than one micron. This provides a significant advantage over traditional semiconductor technologies in which each device and its associated interconnect can take up several tens of square microns.

In accordance with another aspect of the present invention, pass transistors are used in the EEPROM configured MDMs ("MDM-EEPROMs") for providing EEPROM devices with DRAM-type densities. Alternatively, the materials of the MDM devices or separate diodes or thin film transistors ("TFTs") may be used in place of the silicon pass transistors to prevent cell-to-cell short circuits in an array having a plurality of devices. In accordance with one aspect of the present invention, data may be written to the MDM-EEPROM device by applying a constant or pulsed bias to the electrodes of the MDM-EEPROM device to promote dendrite growth. As described above, the growth of the dendrite changes both the resistance and capacitance of the device, both of which can be detected using any convenient method.

As the MDM-EEPROM device exhibit highly nonvolatile characteristics, and as the dendrite position (and hence resistance and capacitance) is in part a function of the magnitude and duration of the applied voltage, multiple-state or n-state logic storage is also possible. In this storage scheme, more than two levels (i.e., binary) may be held in each storage cell; thus, increasing the overall storage density greatly. For example, 4-state storage (possible by using four dendrite positions) allows a doubling of memory capacity per unit area for the same storage cell size. Thus, in accordance with various aspects of the present invention, MDM-EEPROM device may be able to store a continuum of analog, rather than digital, quantities. The storage of analog values in conventional memory technologies is extremely difficult if not impossible.

In accordance with another aspect of the present invention, the MDM-EEPROM device may be "conditioned" by applying a conditioning bias with a suitably low current limit. The conditioning bias is applied for a sufficient length of time to permit the growth of a nonvolatile metal dendrite to connect the electrodes of the MDM-EEPROM device. A short erase bias with a suitably high current limit is applied to break the metal dendrite thereby "erasing" the MDM-EEPROM device. A read bias with a sufficiently low voltage limit to prevent dendrite growth is applied to "read" the MDM-EEPROM device. A write bias with a low current limit is applied to close the break in the dendrite thereby "re-writing" the MDM-EEPROM device.

The MDM-EEPROM device can be erased, read, and written by applying different bias with the same or different polarities depending upon operational requirements. For example, the MDM-EEPROM device can be erased with a forward bias, read with a reverse bias, and written with a forward bias, or various other combinations.

3. Military and Aerospace Applications

The present invention has many attributes which lead to other potential fields of use. In general, read/write electronic memories are based on the principle of a charge storage. For example, in DRAMs the charge is stored for a few microseconds, in EEPROMs the charge may be stored for years. Unfortunately, there are various processes which can change this charge such as ionizing radiation. For example, in military and space applications, alpha particles, when passing through a typical semiconductor device, leave a charged trail which alters the charge in the semiconductor device. In the case of memory technologies, this leads to soft errors and data corruption. The present invention, on the other hand, does not depend on charge storage but on a physical change in the materials, this material being unaffected by relatively large doses of radiation. In other words, the present invention is radiation hard. This provides significant advantages for military and space systems as well as many high-integrity commercial systems such as aircraft and navigation systems.

4. Synthetic Neural Systems

Another application of the present invention is in synthetic neural systems ("SNS"). SNS devices are based on the workings of the human brain and are destined to become the next generation of computing and control devices. SNS devices rely on the ability to make connections between elements as part of a "learning" process. Connections are formed between the most active circuit nodes (i.e., those nodes which have signals present for a majority of the time). The "training" of the systems, by the application of input, results in a form of hard-wired logic. However, this type of system is extremely difficult to achieve with conventional silicon-based devices. On the other hand, in accordance with the present invention, SNS systems can be configured with MDM devices. As described above, in MDM devices, the formation of a dendrite depends on the presence of a voltage signal, thus connections naturally form between the most active nodes as the dendrites grow toward the electrodes which have voltages applied to them. In addition, the strength of the connection, governed by its capacitance, will depend on the strength of the input. This directable analog memory effect is another significant aspect of the present invention.

III. Programmable Resistance/Capacitance Devices

As described above, a PSAM structure may be used for implementing various different technologies such as programmable resistance and capacitance ("PR/C") devices. Accordingly, with reference to FIG. 8, a PR/C device 800 in accordance with various aspects of the present invention is shown. In an exemplary embodiment, the PR/C device 800 preferably includes a substrate 810 which provides the physical support for the PR/C device 800. If the substrate 810 is non-insulating or otherwise incompatible with the materials used in the PR/C device 800, an insulator 820 may be disposed on the substrate 810 to isolate the active portion of the PR/C device 800 from the substrate 810. Next, a bottom electrode 830 may be deposited and patterned on the substrate 810 (or the insulating layer 820 if an insulator is used). Next, an ion conductor 840 is preferably deposited and patterned over the bottom electrode 830 and the substrate 810 (or the insulating layer 820 if an insulator is used). Next, a dielectric film 850 may be deposited over the ion conductor 840 and vias are opened over a portion of the ion conductor 840 and the bottom electrode 830 layers. Finally, a top electrode 860 is preferably deposited and patterned in the vias. Suitable interconnects to the bottom electrode 830 and the top electrode 860 are provided using any convenient method.

When an appropriate voltage is applied between the top electrode 860 (cathode) and the bottom electrode 830 (anode), a nonvolatile metal dendrite 870 grows through the ion conductor 840 toward the bottom electrode 830 (anode).

Similar to the PSAM structures described above, the growth and changes in the length of the nonvolatile metal dendrite 870 affects the electrical characteristics (e.g., the resistance, the capacitance, and the like) of the PR/C device 800.

The PR/C device 800 also can be appropriately patterned to provide isolation from multiple adjacent PR/C devices. Additionally, a dielectric film can be deposited over the top electrode 860 and the entire structure can be repeated. Thus, rows and columns of PR/C devices may be fabricated into a high density configuration to provide extremely large densities.

Figure 9:
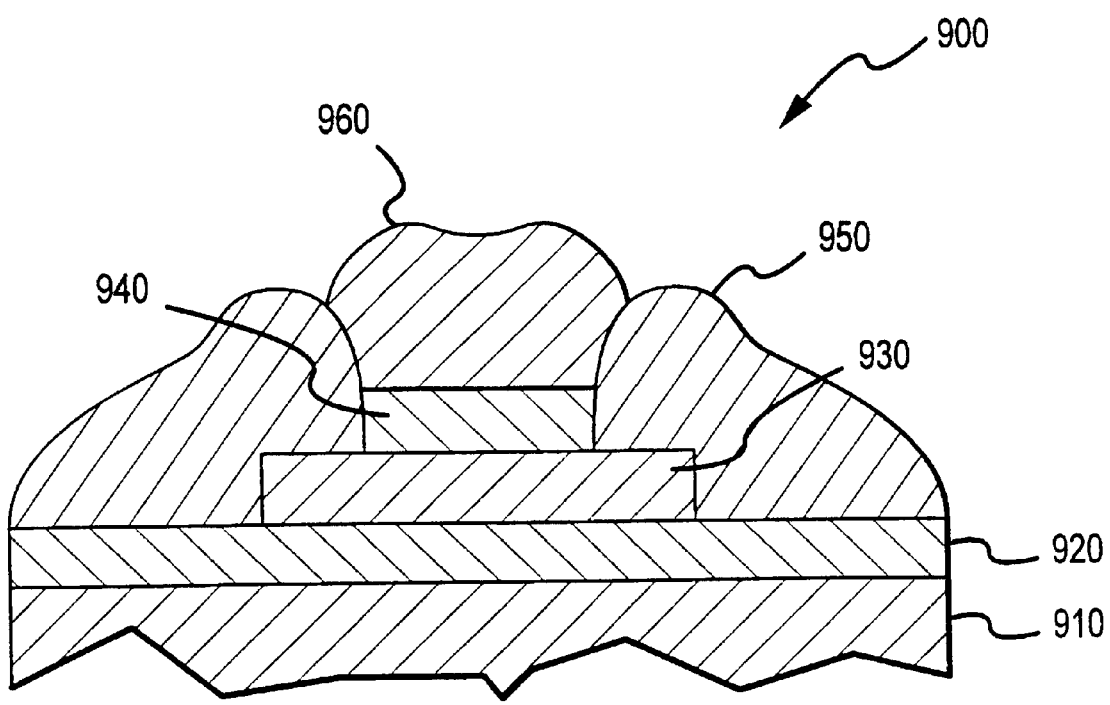
FIG. 9 is a cross-sectional view of another exemplary programmable resistance/capacitance device in accordance with various aspects of the present invention.

It should be appreciated that various possible configurations or methods for constructing a PR/C device can be used in accordance with the present invention. For example with reference to FIG. 9, in a PR/C device 900 a dielectric film 950 is preferably deposited over a bottom electrode 930 and a substrate 910 (or an insulating layer 920 if an insulator is used). Vias may be opened over a portion of the bottom electrode 930. An ion conductor 940 may be deposited and patterned over the bottom electrode 930 within the vias. Next, a top electrode 960 may be deposited and patterned in the vias.

As discussed earlier in connection with FIG. 7, MDM devices in accordance with some embodiments of the invention include an electrode or electrodes additional to the two electrodes utilized to program dendrite growth, which can be used for "outputs" of the devices. The same structures as illustrated in FIG. 7 are applicable for providing programmable capacitance and resistant elements in contexts other than memory elements and for appropriate application anywhere capacitance and resistance elements are utilized.

The PR/C devices of the present invention are typically constructed so as to be physically larger than the MDM devices of FIGS. 5A, 6 and 7 so that a greater parametric variability may be attainable. The PR/C devices of the present invention may be suitably "programmed" using a DC voltage with a relatively high current levels; consequently, a small signal AC voltage or DC voltage with a relatively low current levels would not affect the dendrite condition and hence the resistance or capacitance would not vary. These programmable devices may be used as tuned circuits in general (e.g., frequency selection in communication systems, tone controls and audio systems, voltage controlled filter circuits), voltage controlled oscillators ("VCOs"), signal level (e.g., volume controls), automatic gain controls ("AGC"), and the like.

Figure 8:
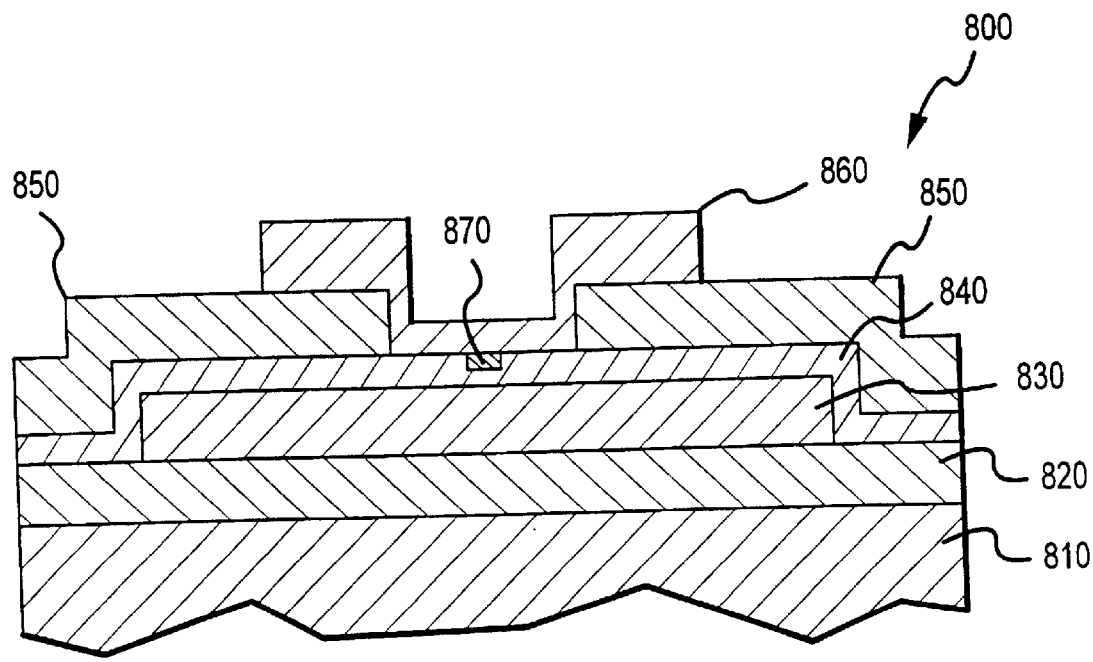
FIG. 8 is a cross-sectional view of yet another exemplary programmable resistance/capacitance device in accordance with various aspects of the present invention.

With continued reference to FIG. 8, the exemplary PR/Cs represent a significant departure from conventional silicon-based microelectronics. In fact, silicon is not even required for the operation of the PR/C. Also, the overall manufacturing process is considerably simpler than even the most basic semiconductor processing techniques. The simple processing techniques coupled with reasonable material costs provide a device with a low production cost.

IV. Conclusion

Thus, in accordance with the present invention, a low cost, highly manufacturable device is obtained that may be employed in a variety of applications such as memory devices, programmable resistor and capacitor devices, and the like.

Although the present invention is set forth herein in the context of the appended drawing figures, it should be appreciated that the invention is not limited to the specific forms shown. Various other modifications, variations, and enhancements in the design, arrangement, and implementation of, for example, the PSAM structure, as set forth herein may be made without departing from the spirit and scope of the present invention. Furthermore, one of skill in the art will appreciate that various other applications and uses exist for the PSAM structure besides the specific examples given.

What is claimed is:

1. A programmable sub-surface aggregating metallization (PSAM) structure comprising:
    an ion conductor;
    a plurality of electrodes disposed on said ion conductor, wherein at least two of said electrodes are configured for growing a metal dendrite from the negative of the two electrodes toward the positive of the two electrodes through said ion conductor when a voltage is applied between said two electrodes.

2. A PSAM structure in accordance with claim 1, wherein said ion conductor is formed from a chalcogenide material containing metal ions.

3. A PSAM structure in accordance with claim 2, wherein said chalcogenide material is selected from the group consisting of sulfur, selenium and tellurium, and said metal ions are formed from a metal selected from the group consisting of silver, copper and zinc.

4. A PSAM structure in accordance with claim 3, wherein said ion conductor contains arsenic trisulphide-silver.

5. A PSAM structure in accordance with claim 1, wherein at least one of said plurality of electrodes is formed from an electrically conducting material containing silver.

6. A PSAM structure in accordance with claim 1, wherein said plurality of electrodes further comprises:
    a first layer of electrically conductive material; and
    a second layer of electrically conductive material, wherein said ion conductor is disposed between said first and second layers of conductive material.

7. A PSAM structure in accordance with claim 6 wherein said first and second layer of electrically conductive material and said ion conductor are formed on a substrate material for strength and rigidity.

8. A programmable sub-surface aggregating metallization (PSAM) structure comprising:
    an ion conductor;
    a cathode;
    an anode, said cathode and anode arranged opposing one another on said ion conductor; and
    a metallic dendrite, said metallic dendrite extending from said cathode toward said anode through said ion conductor when a first series of pulses of electricity is applied between said cathode and anode.

9. A PSAM structure in accordance with claim 8, wherein said metallic dendrite has a length which affects the electrical characteristics of the PSAM structure, and said length of said metallic dendrite remains intact when said first series of pulses of electricity is removed.

10. A PSAM structure in accordance with claim 9, wherein said length of said metallic dendrite decreases when a second series of pulses of electricity is applied, said second series of pulses of electricity having an opposite polarity to said first series of pulses of electricity.

11. A PSAM structure in accordance with claim 8, wherein said first series of pulses of electricity is applied until said metallic dendrite contacts said anode.

12. A PSAM structure in accordance with claim 11, wherein a gap is formed in said metallic dendrite when a third series of pulses of electricity is applied between said cathode and anode, said third series of pulses of electricity having a high current set point and a low voltage limit.

13. A PSAM structure in accordance with claim 12, wherein said gap formed in said metallic dendrite is reclosed when a fourth series of pulses of electricity is applied between said cathode and anode, said fourth series of pulses of electricity have a high voltage set point and a low current limit.

14. A PSAM structure in accordance with claim 8, wherein said ion conductor further comprises of a chalcogenide material containing metal ions, wherein said chalcogenide material is selected from the group consisting of sulfur, selenium and tellurium, and said metal ions are formed from a metal selected from the group consisting of silver, copper and zinc.

15. A PSAM structure in accordance with claim 8, wherein said cathode and/or anode is formed from an electrically conductive material containing silver.

16. A method of forming a PSAM structure comprising the steps of:
   providing a cathode;
   providing an anode;
   providing an ion conductor material disposed between said cathode and anode such that a metal dendrite grows from said cathode toward said anode through said ion conductor material when a first voltage is applied between said cathode and said anode.

17. A method of forming a PSAM structure in accordance with claim 16, wherein said step of providing an ion conductor material further comprises the step of forming an ion conductor material from a chalcogenide material selected from the group consisting of sulfur, selenium, and tellurium, and a metal selected from Group IB or Group IIB of the periodic chart.

18. A method of forming a PSAM structure in accordance with claim 16, further comprising the step of providing a substrate for supporting said PSAM structure.

19. A method of forming a PSAM structure in accordance with claim 16, further comprising the steps of:
   conditioning the PSAM structure by growing a metal dendrite from said cathode to said anode through said ion conductor;
   erasing the PSAM structure by forming a gap in said metal dendrite by applying a second voltage between said cathode and anode;
   writing to the PSAM structure by reclosing said gap by applying a third voltage between said cathode and anode.

20. A method of forming a PSAM structure in accordance with claim 19, further comprising the step of:
   reading the PSAM structure by applying a fourth voltage between said cathode and anode, wherein said fourth voltage is a short low current pulse.

21. A programmable sub-surface aggregating metallization structure comprising:
   an ion conductor;
   a plurality of electrodes disposed on said ion conductor, wherein at least two of said electrodes are configured change an electrical property of the ion conductor when a voltage is applied between said two electrodes.

22. The programmable sub-surface aggregating metallization structure of claim 21, wherein said ion conductor is formed from a chalcogenide material containing metal ions.

23. The programmable sub-surface aggregating metallization structure in accordance with claim 21, wherein said chalcogenide material is selected from the group consisting of sulfur, selenium and tellurium, and said metal ions are formed from a metal selected from the group consisting of silver, copper and zinc.

24. The programmable sub-surface aggregating metallization structure in accordance with claim 21, wherein said ion conductor contains a material having a cation selected from the group consisting of arsenic and germanium and an anion selected from the group consisting of sulfur and selenium.

25. The programmable sub-surface aggregating metallization structure in accordance with claim 21, wherein at least one of said plurality of electrodes is formed from an electrically conducting material containing silver.

26. The programmable sub-surface aggregating metallization structure in accordance with claim 21, wherein said plurality of electrodes further comprises:
   a first layer of electrically conductive material; and
   a second layer of electrically conductive material, wherein said ion conductor is disposed between said first and second layers of conductive material.

* * * * *